United States Patent
Biskup et al.

(10) Patent No.: US 10,901,019 B2
(45) Date of Patent: Jan. 26, 2021

(54) METHOD OF CONNECTING CELL VOLTAGE SENSORS

(71) Applicant: Atieva, Inc., Redwood City, CA (US)

(72) Inventors: Richard J. Biskup, Redwood City, CA (US); Sam Chang, San Jose, CA (US)

(73) Assignee: Atieva, Inc., Redwood City, CA (US)

( * ) Notice: Subject to any disclaimer, the term of this patent is extended or adjusted under 35 U.S.C. 154(b) by 1464 days.

(21) Appl. No.: 13/835,760

(22) Filed: Mar. 15, 2013

(65) Prior Publication Data

US 2014/0278174 A1 Sep. 18, 2014

(51) Int. Cl.
*G01R 27/14* (2006.01)
*G01R 31/3842* (2019.01)
*G01R 31/396* (2019.01)

(52) U.S. Cl.
CPC ......... *G01R 27/14* (2013.01); *G01R 31/3842* (2019.01); *G01R 31/396* (2019.01)

(58) Field of Classification Search
CPC ............... G01R 27/14; G01R 31/3624; G01R 31/3658; G06F 17/10
USPC ............................................ 702/65; 324/713
See application file for complete search history.

(56) References Cited

U.S. PATENT DOCUMENTS

| | | | |
|---|---|---|---|
| 4,456,965 A | 6/1984 | Graber et al. | |
| 4,760,434 A | 7/1988 | Tsuzuki et al. | |
| 5,079,608 A | 1/1992 | Wodarczyk et al. | |
| 6,108,219 A | 8/2000 | French | |
| 6,172,383 B1 | 1/2001 | Williams | |
| 6,286,491 B1 | 9/2001 | Fukatsu et al. | |
| 6,639,408 B2 | 10/2003 | Yudahira et al. | |
| 6,944,695 B1 | 9/2005 | Tangen | |
| 6,960,899 B2 | 11/2005 | Kobayashi et al. | |
| 7,288,919 B2 | 10/2007 | Morita | |
| 7,459,885 B2 | 12/2008 | Miyamoto | |
| 7,638,977 B2 | 12/2009 | Park | |

(Continued)

FOREIGN PATENT DOCUMENTS

| | | |
|---|---|---|
| EP | 0992811 | 12/2000 |
| EP | 1676427 | 8/2012 |

(Continued)

OTHER PUBLICATIONS

Energizer, Eveready Carbon Zinc., Battery Application Mnual Nov. 6, 2001.*

(Continued)

*Primary Examiner* — Yoshihisa Ishizuka
(74) *Attorney, Agent, or Firm* — Brake Hughes Bellermann LLP

(57) ABSTRACT

A battery pack monitoring apparatus is provided. The apparatus includes a voltage measurement system configured to couple to opposed ends of each of a plurality of blocks of a battery pack and to measure voltages thereof, the blocks being coupled in series by interconnects each having an interconnect resistance. The voltage measurement system is configured to derive an internal resistance of each of the plurality of blocks based upon the voltages of the opposed ends of each of the plurality of blocks and based upon a measurement of current of the battery pack and derive the interconnect resistance of each of the interconnects based upon the voltages of the opposed ends of each of the plurality of blocks and based upon the measurement of current.

20 Claims, 4 Drawing Sheets

(56) References Cited

U.S. PATENT DOCUMENTS

| | | | |
|---|---|---|---|
| 7,656,164 | B2 | 2/2010 | Kawamura |
| 7,768,034 | B2 | 8/2010 | Calafut et al. |
| 7,839,217 | B2 | 11/2010 | Okuma |
| 7,924,016 | B2 | 4/2011 | Shimizu |
| 8,092,932 | B2 | 1/2012 | Phillips et al. |
| 8,106,706 | B2 | 1/2012 | Easwaran et al. |
| 8,174,237 | B2 | 5/2012 | Kosugi et al. |
| 8,212,571 | B2 | 7/2012 | Emori et al. |
| 8,222,863 | B2 | 7/2012 | Sakakibara |
| 8,231,996 | B2 | 7/2012 | Howard et al. |
| 8,354,186 | B2 | 1/2013 | Muis |
| 8,536,826 | B2 | 9/2013 | Matsuoka et al. |
| 8,542,056 | B2 | 9/2013 | Rossi et al. |
| 8,586,230 | B2 | 11/2013 | Kim et al. |
| 8,587,318 | B2 | 11/2013 | Chandler et al. |
| 8,598,939 | B2 | 12/2013 | Shimizu et al. |
| 8,719,477 | B2 | 5/2014 | Kaneko |
| 8,729,864 | B2 | 5/2014 | Dittmer et al. |
| 8,786,261 | B2 | 7/2014 | Andrea |
| 8,868,807 | B2 | 10/2014 | Kashima |
| 8,922,165 | B2 | 12/2014 | Bills |
| 8,933,665 | B2 | 1/2015 | Athas et al. |
| 9,046,584 | B2 | 6/2015 | Tsuchiya et al. |
| 2004/0225814 | A1 | 11/2004 | Ervin |
| 2004/0238261 | A1* | 12/2004 | Kodama .............. B62D 5/0484 180/443 |
| 2008/0090139 | A1* | 4/2008 | Hurst .................. H01M 2/1016 429/156 |
| 2009/0208821 | A1* | 8/2009 | Kosugi ................ B60L 3/0046 429/61 |
| 2010/0301868 | A1* | 12/2010 | Ishikawa ............ G01R 31/3658 324/434 |
| 2011/0213509 | A1* | 9/2011 | Onnerud ............ H01M 2/1077 700/297 |
| 2012/0119745 | A1* | 5/2012 | Deveau .............. G01R 31/3631 324/429 |
| 2012/0194135 | A1 | 8/2012 | Mizoguchi |
| 2013/0052514 | A1 | 2/2013 | Kim |
| 2013/0257381 | A1* | 10/2013 | Diamond ............ B60L 11/1861 320/134 |
| 2014/0103877 | A1* | 4/2014 | Sahu .................. H01M 10/482 320/118 |

FOREIGN PATENT DOCUMENTS

| | | |
|---|---|---|
| EP | 2506390 | 10/2012 |
| EP | 2538513 | 12/2012 |
| JP | 2003309982 | 10/2003 |
| JP | 2010183766 | 8/2010 |
| JP | 2012208068 | 10/2012 |
| KR | 1020060111946 | 10/2006 |
| KR | 1020100088369 | 8/2010 |
| KR | 1020110056699 | 5/2011 |
| KR | 1020120055241 | 5/2012 |
| WO | WO 2011072939 | 6/2011 |

OTHER PUBLICATIONS

Parks, James E., Ohm's Law III Resistors in Series and Parallel, Department of Physics and Astronomy, University of Tennessee, 2007.*

Hyperphysics—Resistance and Resistivity.http://hyperphysics.phyastr.gsu.edu/hbase/electric/resis.html. waybackmachine. 2000.*

Goodenough, Frank. "Isolate, Amplify, Multiplex 4+ Channels," Analog Dialogue, 1980, pp. 3-4, vol. 14, No. 2.

International Search Report, PCT/US2014/028616, dated Jul. 7, 2014.

International Search Report, PCT/US2014/025518, dated Jun. 18, 2014.

International Search Report, PCT/US2014/022807, dated Jul. 3, 2014.

International Search Report and the Written Opinion of the International Searching Authority, PCT/US2014/024861, dated Sep. 18, 2014.

Notification of Transmittal of the International Search Report and Written Opinion of the International Searching Authority, PCT/US2014/028636, dated Aug. 26, 2014.

Notification of Transmittal of the International Search Report and Written Opinion of the International Searching Authority, PCT/US2014/028658, dated Aug. 13, 2014.

* cited by examiner

METHOD OF CONNECTING CELL VOLTAGE SENSORS

BACKGROUND

Battery packs may be monitored or unmonitored with regard to voltage sensing and current sensing. In an unmonitored battery pack, changes in connection resistance can go unnoticed until the battery pack suddenly fails outright. The typical implementation of cell voltage sensing uses only one voltage measurement per block. In addition, the location of the voltage sensing is chosen for packaging convenience, so the connection resistances are difficult to estimate. In monitored battery packs, sensors and circuitry can fail, leaving the blocks unmonitored.

It is within this context that the embodiments arise.

SUMMARY

In one embodiment, a battery pack monitoring apparatus is provided. The apparatus includes a voltage measurement system configured to couple to opposed ends of each of a plurality of blocks of a battery pack and to measure voltages thereof, the blocks being coupled in series by interconnects each having an interconnect resistance. The voltage measurement system further configured to derive an internal resistance of each of the plurality of blocks based upon the voltages of the opposed ends of each of the plurality of blocks and based upon a measurement of current of the battery pack. The voltage measurement system further configured to derive the interconnect resistance of each of the interconnects based upon the voltages of the opposed ends of each of the plurality of blocks and based upon the measurement of current.

In another embodiment, a battery pack monitoring apparatus is provided. The apparatus includes a first voltage measurement unit configured to couple to a negative terminal of a battery pack, to a positive terminal of the battery pack, and to a first end of each of a plurality of block interconnects of the battery pack. The apparatus includes a second voltage measurement unit configured to couple to the negative terminal of the battery pack, to the positive terminal of the battery pack, and to a second end of each of the plurality of block interconnects. The first voltage measurement unit and the second voltage measurement unit are configured to derive an interconnect resistance of each of the interconnects based upon voltages of the first end and the second end of each of the plurality of block interconnects and based upon a measurement of current of the battery pack. The first voltage measurement unit and the second voltage measurement unit are configured to derive an internal resistance of each of a plurality of blocks of the battery pack based upon voltages of the first end and the second end of each of the plurality of block interconnects and based upon the measurement of current. The battery pack includes the plurality of blocks with each block of the plurality of the blocks being connected in series by the block interconnects.

In yet another embodiment, a method of monitoring a battery pack is provided. The method includes measuring voltages of first ends of a plurality of interconnects that serially couple blocks of a battery pack, wherein for each of the plurality of interconnects a first end is closer to a negative terminal of the battery pack and an opposed second end is closer to a positive terminal of the battery pack. The method includes measuring voltages of opposed second ends of the plurality of interconnects and measuring a current of the battery pack. The method includes calculating an interconnect resistance of each of the plurality of interconnects based upon the current, the voltages of the first ends of the interconnects and the voltages of the opposed second ends of the interconnects. The method includes calculating an internal resistance of each of the blocks based upon the current, the voltages of the first ends of the interconnects and the voltages of the opposed second ends of the interconnects.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
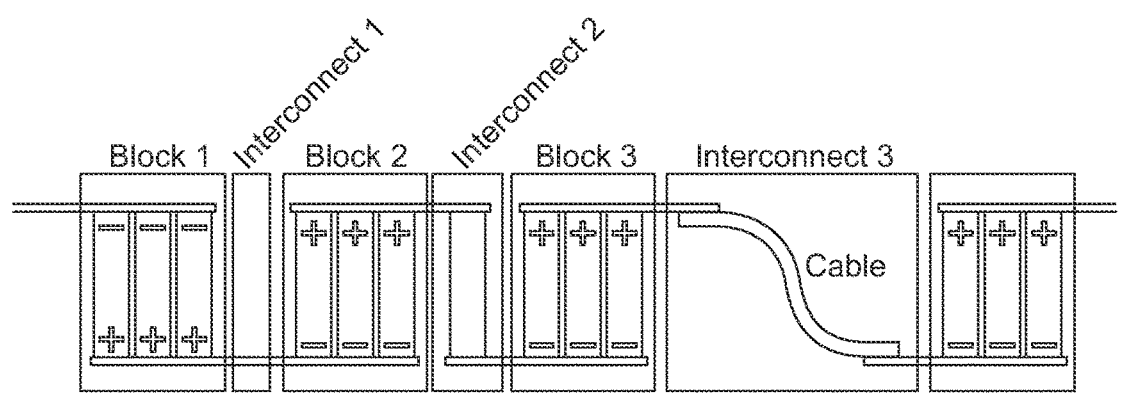
FIG. 1 is a side view of a battery pack with interconnects coupling blocks of cells in series.

A battery pack monitoring apparatus and related method are provided. Various types of interconnects are utilized to couple blocks of cells in series in a battery pack. The interconnects and blocks of a battery pack are monitored by the voltage measurement unit and the voltage measurement systems described herein. Various embodiments of the voltage measurement systems, and the method of monitoring a battery pack, provide for the distribution of voltage sensors in the battery pack to allow for redundant voltage sensing of the cells in the battery pack. In addition, the determination of the resistance of connections between the cells of the battery pack, and estimation of the current applied to the battery pack, are enables through the embodiments described below. The embodiments described herein provide for redundant cell voltage sensing (increased reliability of cell voltage sensing), back-up current estimation if a current sensor fails (increased reliability of current sensing), estimation of cell internal resistance (for monitoring cell health), and estimation of connection resistance (monitoring of connection health). This application is related to U.S. application Ser. Nos. 13/794,535, 13/834,983, 13/835,170, 13/835,377, and 13/835,595 each of which is incorporated herein by reference for all purposes.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
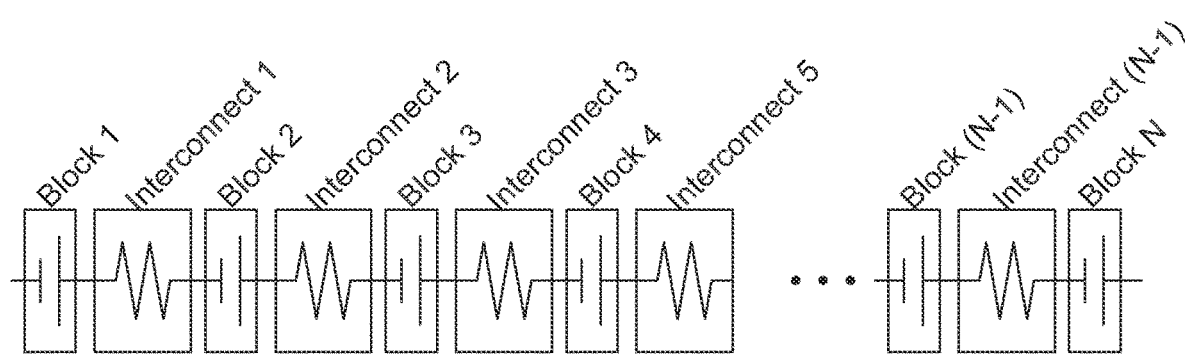
FIG. 2 is a schematic of the battery pack of FIG. 1.

A battery pack is often made of many blocks of battery cells connected in series, where each block of battery cells is made of many individual battery cells connected in parallel. The series connection between two blocks introduces a resistance in addition to the internal resistance of the cells of each block. Often, there are several different kinds of connections between blocks, depending on the design of the pack. FIG. 1 depicts a battery pack with different kinds of connections or interconnects, such as Interconnect 1, Interconnect 2, and Interconnect 3 between Block 1, Block 2, and Block 3, respectively. The system of FIG. 1 is represented schematically in FIG. 2, which shows Block 1 coupled in series to Block 2 by Interconnect 1. Block 2, Block 3 and Block 4 are coupled in series by Interconnect 2 and Interconnect 3. Interconnect 4 couples the Block 4 to further blocks, which include Block (N−1) coupled to another block Block N by Interconnect (N−1). It should be appreciated that a block may have as few as one battery cell or may have two or more cells in parallel, and that the interconnects between blocks can be of a uniform type for all interconnects or of mixed types. Interconnects can be in the form of a bus bar, a connecting plate, a cable or other type of wire and other commercially available interconnect structures.

It is often the case that the voltage of each block of the battery pack must be measured. In many applications, the voltage measurement is desired and therefore the reliability of the voltage sensing is also important. In addition, it is desired to reliably measure the current applied to the battery. Measurement of the current is usually accomplished with a dedicated current sensor. For any two blocks connected together in series, there is a resistance due to the connection. As the battery pack ages, the quality of the connection often degrades and becomes a risk of failure. The condition of the connection can be determined by estimating the resistance of the connection. As the battery ages, it is also desirable to estimate the internal resistance of the cells in each block.

Figure 3:
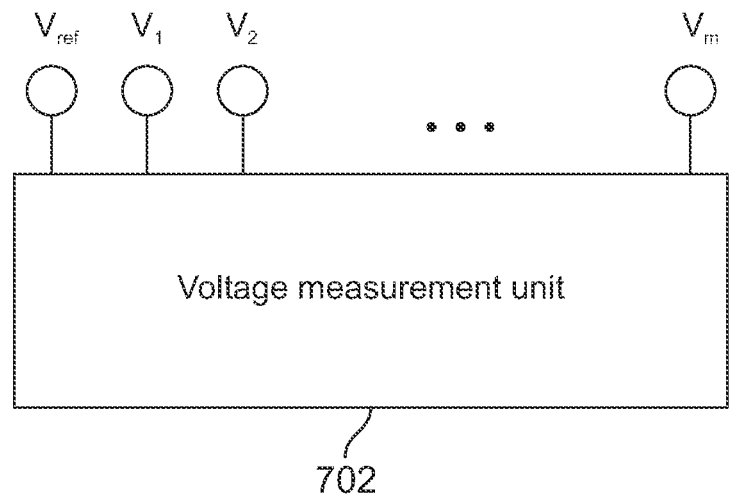
FIG. 3 is a schematic of a voltage measurement unit in accordance with some embodiments.

FIG. 3 is a simplified schematic of a voltage measurement unit that is enabled to measure m voltages relative to a single reference in accordance with some embodiments. The voltages of Block 1, Block 2, Block 3, Block 4, Block (N−1), and Block N of the battery pack are measured by multiple voltage measurement units 302. Each voltage measurement unit 302 measures the values $(V_1-V_{ref})$, $(V_2-V_{ref})$, $(V_3-V_{ref})$, ..., $(V_m-V_{ref})$.

Figure 4:
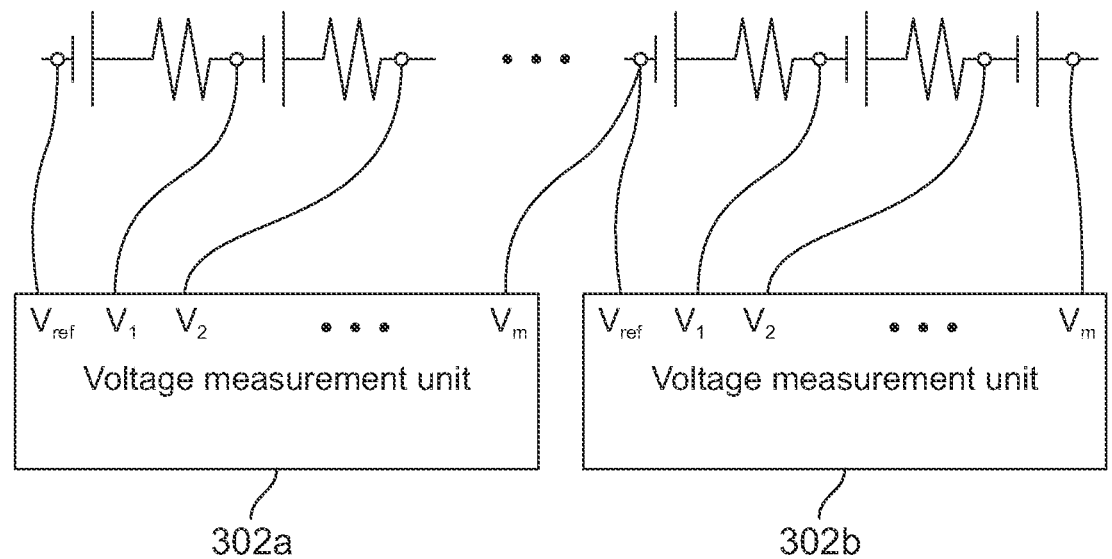
FIG. 4 is a schematic of a voltage measurement system in accordance with some embodiments.

To measure all N blocks, the voltage measurement units are chained together as depicted in FIG. 4. As FIG. 4 illustrates, each voltage is measured at the same side of the interconnects, and the $V_{ref}$ of each voltage measurement unit is connected to the $V_m$ of the previous voltage measurement unit. Exceptions occur at the very last block and the very first block of the pack, where an additional interconnect may not exist. Specifically, FIG. 4 shows a first voltage measurement unit 302a coupled to the negative terminal of the battery as a reference voltage $V_{ref}$, coupled to the higher side of a first interconnect as a first voltage input $V_1$, coupled to a higher side of a second interconnect as a second voltage input $V_2$, and so on. A second voltage measurement unit 302b is coupled to the $V_m$ of the first voltage measurement unit 302a as a reference voltage $V_{ref}$, coupled to the higher side of a first interconnect as a first voltage input $V_1$, coupled to a higher side of a next interconnect as a second voltage input $V_2$ and so on, up to the positive terminal of the battery, which is connected to the $V_m$ of the second voltage measurement unit 302b. It should be appreciated that the higher side of an interconnect is also the lower side of a block, and vice versa. Similarly, the lower side of an interconnect is also the higher side of a block, and vice versa. Here, lower and higher are relative, electrically speaking, to the negative terminal and the positive terminal of the battery. In other words, the lower side or end of an interconnect or a block is electrically closer to the negative terminal of the battery than the higher side or end of the interconnect or the block, which is electrically closer to the positive terminal of the battery. It should be appreciated that the lower end may be referred to as a first end of an interconnect or a block and the higher end may be referred to as a second end of an interconnect or block where the first and second ends are opposed ends of the interconnect or block. The voltage measurement system of FIG. 4 includes one or more voltage measurement units 302a-b and the configuration, which could include various combinations of couplings and software, firmware or hardware to perform operations.

Using the arrangement shown in FIG. 4, the voltage measurement system can be used to estimate the sum of the block resistance and the corresponding interconnect resistance for each block. This can be estimated by computing the voltage drop that occurs when a current pulse is applied. The amount of current applied is either determined beforehand or measured by the current sensor in the pack. The resistance can then be estimated by the formula $R_{block\_i}+R_{interconnect\_i}=(V_i(t_1)-V_i(t_2)-V_{i-1}(t_1)+V_{i-1}(t_2))/(I(t_1)-I(t_2))$, where $I(t)$ is the current at time t.

The resistance values $R_{block\_i}+R_{interconnect\_i}$ can be used to provide a second measure of the current I, in case the current sensor on the battery pack fails. For example, given an estimate of $R_{block\_1}+R_{interconnect\_1}$ and $R_{block\_2}+R_{interconnect\_2}$, the current at any time can be estimated by the formula $I_{estimated}=((V_2-V_1)-(V_1-V_{ref}))/((R_{block\_2}+R_{interconnect\_2})-(R_{block\_1}+R_{interconnect\_1}))+e$, where e is the difference in cell voltage between Block 1 and Block 2 divided by $((R_{block\_2}+R_{interconnect\_2})-(R_{block\_1}+R_{interconnect\_1}))$. In many applications, the difference in the open circuit voltages between two blocks, i.e., the voltage the blocks would be at when there is no current applied, is kept small, so the current can be estimated within a reasonable margin of error.

The resistance values can also be used to measure the condition of the connections and the blocks by comparing the estimated resistance values for all the blocks. For example, a rapid increase in $R_{block\_1}+R_{interconnect\_1}$ compared to $R_{block\_i}+R_{interconnect\_i}$ for all i would indicate a problem with either Block 1 or Interconnect 1 or both. By postulating models of how the blocks and interconnects degrade, it would be possible to estimate whether it is more likely that the problem is Block 1 or Interconnect 1 or both.

Figure 5:
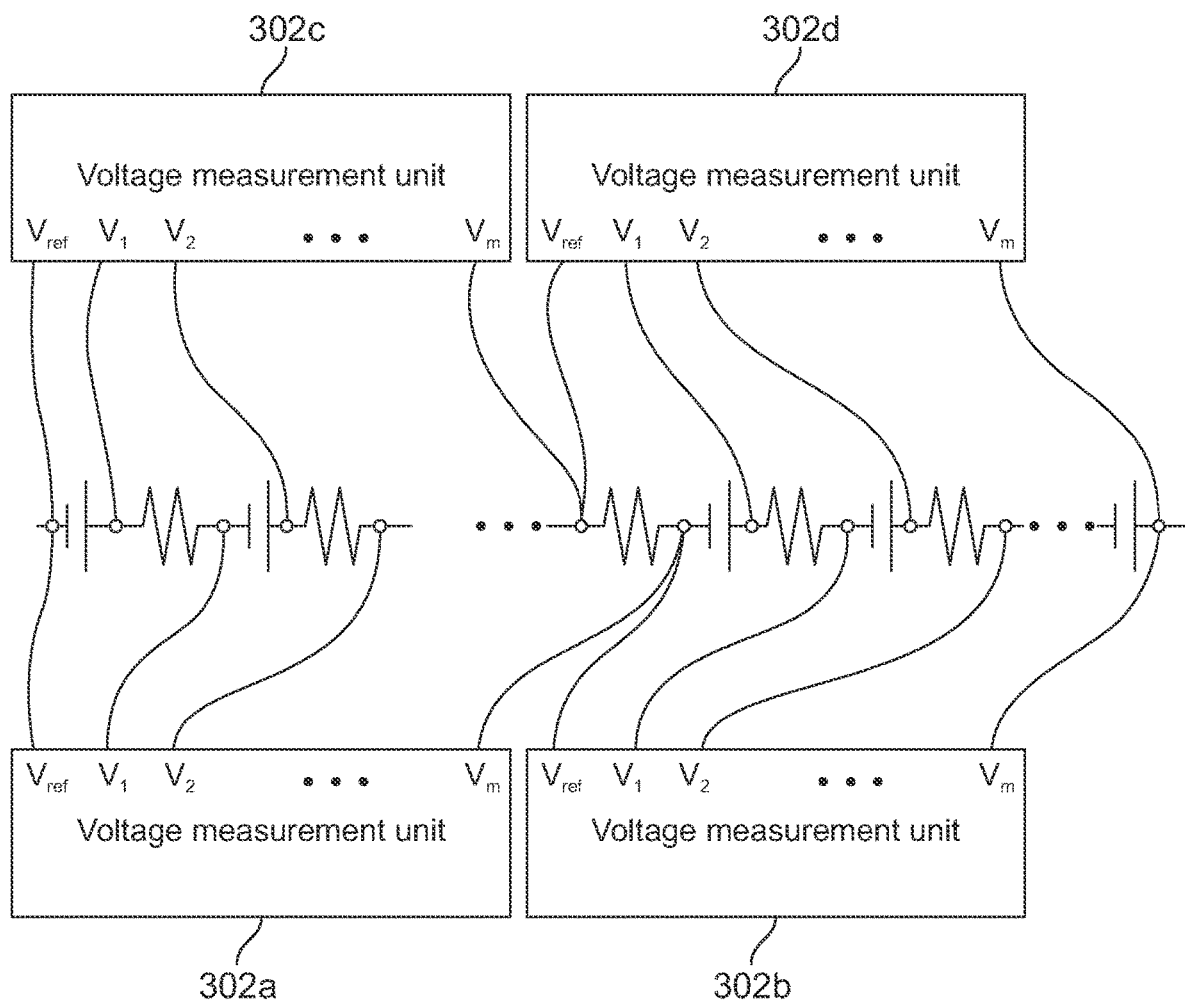
FIG. 5 is a schematic of a further voltage measurement system in accordance with some embodiments.

To have a redundant voltage measurement for all N blocks, voltage measurement units 302a-d can be deployed as depicted in FIG. 5. The voltage measurement system of FIG. 5 includes one or more voltage measurement units 302a-d and the configuration, which could include various combinations of couplings and software, firmware or hardware to perform operations. In one embodiment, the voltage measurement units are coupled to a communication bus or network. A current sensor, such as one with a Hall effect device or a small resistor and voltage measurement across the resistor, can be installed in series with the negative terminal, the positive terminal, or between two between two of the blocks of the battery. For one chain of voltage measurement units 302a-d in the voltage measurement system, each voltage is measured on the same side of the interconnects, while an additional chain of voltage measurement units in the system measures each voltage on the opposite side of the interconnects. For each chain, the $V_{ref}$ of each voltage measurement unit is connected to the $V_m$ of the previous voltage measurement unit. For accuracy of voltage readings, couplings of the voltage measurement units 302a-d to the battery pack should be physically close to the positive or negative terminals of each of the blocks as appropriate.

Specifically, the voltage measurement system in FIG. 5 has a first voltage measurement unit 302c coupled to the negative terminal of the battery and coupled to the higher end of each of the blocks in a lower portion of the battery. A second voltage measurement unit 302d is coupled to the higher end of each of the blocks in an upper portion of the battery, including the positive battery terminal. A third voltage measurement unit 302a is coupled to the lower end of each of the blocks in the lower portion of the battery, including the negative terminal of the battery. A fourth voltage measurement unit 302b is coupled to the lower end of each of the blocks in the upper portion of the battery, and is coupled to the positive terminal of the battery.

Equivalently to the above description, the first voltage measurement unit 302c is coupled to the negative terminal of the battery and to the lower end of each of the interconnects in the lower portion of the battery. The second voltage measurement unit 302d is coupled to the lower end of each of the interconnects in the upper portion of the battery, and to the positive terminal of the battery. The third voltage measurement unit 302a is coupled to the negative terminal of the battery and to the higher end of each of the interconnects in the lower portion of the battery. The fourth voltage measurement unit 302b is coupled to the higher end of each of the interconnects in the upper portion of the battery, and to the positive terminal of the battery.

Using the arrangement shown in FIG. 5, the voltage measurement system can be used to separately estimate the block resistance and the corresponding interconnect resistance for each block. For purposes of discussion, the voltage measurement units 302c-d depicted in the upper half of FIG. 5 are referred to as being in a top chain, measuring top voltages and deriving top resistances, and the voltage measurement units 302a-b depicted in the lower half of FIG. 5 are referred to as being in a bottom chain, measuring bottom voltages and deriving bottom resistances. In various embodiments, the voltage measurement units 302a-d cooperate with each other, communicate with each other, communicate with or otherwise cooperate with another device such as a controller, or are included in a voltage measurement unit. A voltage measurement unit can have subunits or modules.

For each i, the resistance values $R_{bottom\_i}=R_{block\_i}+R_{interconnect\_i}$ can be estimated as before for the bottom chain (i.e., as discussed regarding FIG. 4). By using the same method, the resistance values $R_{top\_i}=R_{block\_i}+R_{interconnect\_(i-1)}$ for each i can be estimated for the top chain. For Block 1, $R_{top\_1}=R_{block\_1}$ because there is no Interconnect 0. Thus, $R_{block\_1}=R_{top\_1}$ and $R_{interconnect\_1}=R_{bottom\_1}-R_{top\_1}$. Then $R_{block\_2}=R_{top\_2}-R_{interconnect\_1}$ and $R_{interconnect\_2}=R_{bottom\_2}-R_{top\_2}$. In general, $R_{block\_i}=R_{top\_i}-R_{interconnect\_(i-1)}$ and $R_{interconnect\_i}=R_{bottom\_i}-R_{top\_i}$. Thus, $R_{block\_i}$ and $R_{interconnect\_i}$ can be determined uniquely. The voltage measurement system of FIG. 5 is thus able to derive or calculate interconnect resistance of each of the interconnects and derive internal resistance of each of the blocks, based upon voltages of the lower end and higher end of each of the plurality of block interconnects and based upon measurement of the current of the battery pack. Equivalently, the voltage measurement system of FIG. 5 is able to derive or calculate interconnect resistance of each of the interconnects and derive internal resistance of each of the blocks, based upon voltages of the lower end and higher end of each of the blocks and based upon measurement of the current of the battery pack.

The resistances $R_{interconnect\_i}$ together with the voltages measured can be used to give a better estimate of the current than possible with only one chain of voltage measurement units 302. The current can be estimated by the formula $I_{estimated}=((V_{top\_(i+1)}-V_{top\_i})-(V_{bottom\_(i+1)}-V_{bottom\_i}))/(R_{interconnect\_(i-1)}-R_{interconnect\_i})$. The margin of error for the current measured in this way is much smaller than before (i.e., as discussed regarding FIG. 4 with only one chain of voltage measurement units 302) because it is not affected by the differences in the open-circuit voltages of two blocks. The voltage measurement system of FIG. 5 is thus able to estimate the current of the battery pack based upon the voltages of the lower end and the higher end of each of the blocks and based upon the derived interconnect resistance of two of the interconnects. Equivalently, the voltage measurement system of FIG. 5 is able to estimate the current of the battery pack based upon the voltages of the lower end and the higher end of each of the interconnects and based upon the derived interconnect resistance of two of the interconnects. This ability to estimate the current of the battery pack is especially useful in the event of a failure of the current sensor, or in a system that has an absence of a current sensor either by design or by failure. It should be appreciated that a separate current sensor may be used to estimate the interconnect resistances in the event of a failure in some embodiments, as the use of the measured voltages and estimated interconnect resistances to estimate current works temporarily in the event of a failure.

Since $R_{block\_i}$ and $R_{interconnect\_i}$ can be estimated separately, it is possible to easily monitor the condition of each connection and of each block of the battery. The voltage measurement system of FIG. 5 increases the reliability of the voltage measurement system (over the system depicted in FIG. 4) because each block voltage is measured redundantly. Even if all of the voltage measurement units of the top chain fail, for example, all the block voltages are still being measured by the bottom chain, and vice versa.

Figure 6:
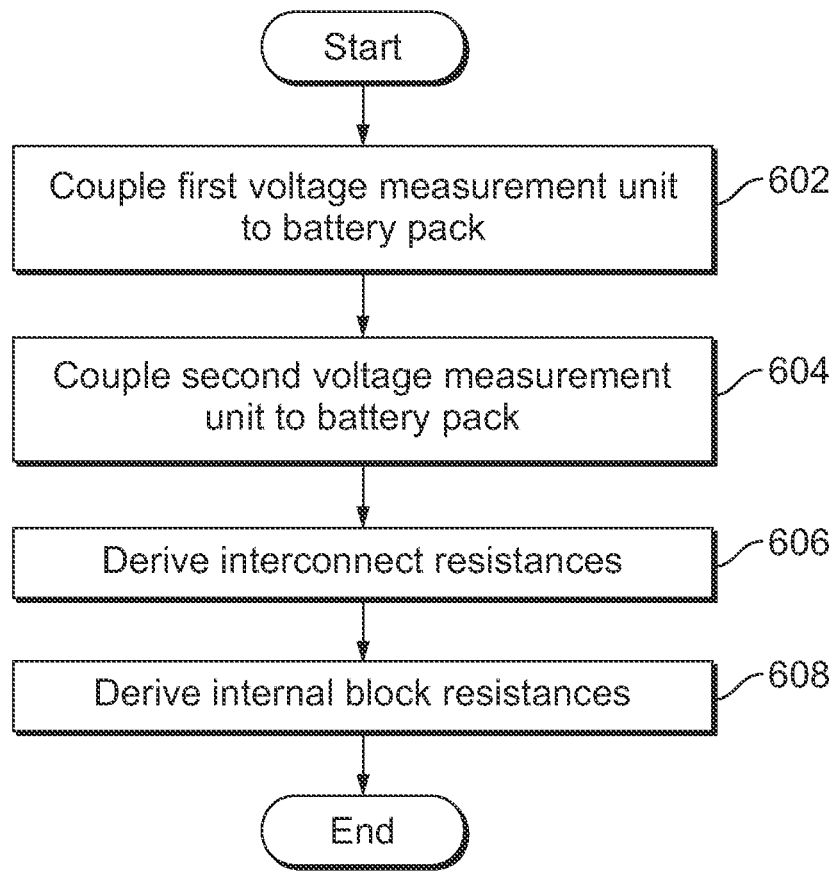
FIG. 6 is a flow diagram of a method of monitoring a battery pack in accordance with some embodiments.

FIG. 6 shows a method of monitoring a battery pack. The method is suitable for monitoring the battery pack of FIGS. 1 and 2. The method can be used in a battery pack monitoring apparatus employing the voltage measurement system of FIG. 5. After a start point, a first voltage measurement unit is coupled to the battery pack, in an action 602. The couplings shown in FIGS. 4 and 5 could be used. Next, a second voltage measurement unit is coupled to the battery pack, in an action 604. The couplings shown in FIG. 5 could be used. Interconnect resistances are derived, in an action 606. For example, the voltages measured and the formulas discussed in relation to FIGS. 4 and 5 could be used. A current of the battery pack could be measured, e.g., by a current sensor, and used in the calculations. Internal block resistances are derived, in an action 608. For example, the voltages measured and the formulas discussed in relation to FIGS. 4 and 5 could be used. If one of the voltage measurement units fails, operation of the other one could be maintained. Either of the voltage measurement units could provide an estimate of current, in the absence of a current sensor. Ongoing monitoring of block resistances and/or interconnect resistances could provide early indication of an impending failure, a failure in progress or a failure that has occurred. Embodiments of the method and related system are thus fault-tolerant and degrade gracefully when subjected to failure. It should be appreciated that the method operations of FIG. 6 may be continually repeated or cycled as the battery pack is being operated.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The embodiments can also be embodied as computer readable code on a computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A battery pack monitoring apparatus, comprising:
   a voltage measurement system coupled to opposed ends of each of a plurality of blocks of a battery pack and to measure voltages thereof, the plurality of blocks being coupled in series by a plurality of interconnects each having a non-zero interconnect resistance and each being a bulbar, a connecting plate, a cable, a wire or other interconnect structure wherein none of the plurality of interconnects comprises a battery cell; and
   the voltage measurement system being further configured to:
      derive an internal resistance of each of the plurality of blocks based upon the voltages of the opposed ends of each of the plurality of blocks and based upon a measurement of current of the battery pack; and
      derive the interconnect resistance of each of the plurality of interconnects based upon the voltages of the opposed ends of each of the plurality of blocks and based upon the measurement of current.

2. The battery pack monitoring apparatus of claim 1, wherein a plurality of the voltages of the opposed ends of each of the plurality of blocks are applied as voltages to a first end and a second end of each of the interconnects.

3. The battery pack monitoring apparatus of claim 1, wherein each of the plurality of blocks has one or more cells in parallel.

4. The battery pack monitoring apparatus of claim 1, further comprising:
   a current sensor coupled to the battery pack and to provide the measurement of current.

5. The battery pack monitoring apparatus of claim 1, wherein the voltage measurement system includes:
   a first voltage measurement unit configured to couple to a negative terminal of a battery pack and to a first end of each of the opposed ends of each of the plurality of blocks; and
   a second voltage measurement unit configured to couple to a second end of each of the opposed ends of each of the plurality of blocks and to the positive terminal of the battery pack.

6. The battery pack monitoring apparatus of claim 1, comprising the voltage measurement system being further configured to estimate the current of the battery pack based upon the voltages of the opposed ends of each of the plurality of blocks and based upon the derived internal resistance of two of the interconnects.

7. A battery pack monitoring apparatus, comprising:
a first voltage measurement unit coupled to a negative terminal of a battery pack, to a positive terminal of the battery pack, and to a first end of each of a plurality of block interconnects of the battery pack, wherein each of the plurality of block interconnects includes a bulbar, a connecting plate, a cable, a wire or other interconnect structure and each having a non-zero interconnect resistance, but none of the plurality of interconnects comprises a battery cell;
a second voltage measurement unit coupled to the negative terminal of the battery pack, to the positive terminal of the battery pack, and to a second end of each of the plurality of block interconnects; and
the first voltage measurement unit and the second voltage measurement unit being configured to:
derive an interconnect resistance of each of the plurality of block interconnects based upon voltages of the first end and the second end of each of the plurality of block interconnects and based upon a measurement of current of the battery pack; and
derive an internal resistance of each of a plurality of blocks of the battery pack based upon voltages of the first end and the second end of each of the plurality of block interconnects and based upon the measurement of current; wherein the battery pack includes the plurality of blocks being connected in series by the plurality of block interconnects.

8. The battery pack monitoring apparatus of claim 7, wherein:
the first voltage measurement unit is operable in an event of a failure of the second voltage measurement unit; and
the second voltage measurement unit is operable in an event of a failure of the first voltage measurement unit.

9. The battery pack monitoring apparatus of claim 7, wherein the first voltage measurement unit and the second voltage measurement unit are further configured to estimate a current of the battery pack, based upon the derived interconnect resistance of two of the plurality of block interconnects, and the voltages of the first end and the second end of each of the plurality of block interconnects, in absence of a current sensor.

10. The battery pack monitoring apparatus of claim 7, wherein the first voltage measurement unit and the second voltage measurement unit are further configured to:
apply the voltages of the first end and the second end of each of the plurality of block interconnects as voltages of second ends and first ends of the plurality of blocks;
apply a voltage of the negative terminal of the battery pack as a reference voltage; and
measure a voltage of the positive terminal of the battery pack.

11. The battery pack monitoring apparatus of claim 7, wherein:
the first voltage measurement unit that couples to the first end of each of the plurality of block interconnects includes couplings that are positioned proximate to positive terminals of the plurality of blocks; and
the second voltage measurement unit that couples to the second end of each of the plurality of block interconnects includes couplings that are positioned proximate to negative terminals of the plurality of blocks.

12. The battery pack monitoring apparatus of claim 7, further comprising:
a current sensor configured to couple to the battery pack and to provide the measurement of current, the current sensor including one from a set consisting of a resistor and a Hall effect device.

13. A method of monitoring a battery pack, comprising:
measuring voltages of first ends of a plurality of block interconnects that serially couple a plurality of blocks of a battery pack, wherein for each of the plurality of block interconnects a first end is closer to a negative terminal of the battery pack and an opposed second end is closer to a positive terminal of the battery pack, and wherein each of the plurality of block interconnects comprises a bulbar, a connecting plate, a cable, a wire or other interconnect structure each having a non-zero interconnect resistance, but does not comprise one or more battery cells;
measuring voltages of opposed second ends of the plurality of block
interconnects; measuring a current of the battery pack;
calculating an interconnect resistance of each of the plurality of block interconnects based upon the current, the voltages of the first ends of the plurality of block interconnects and the voltages of the opposed second ends of the plurality of block interconnects; and
calculating an internal resistance of each of the plurality of blocks based upon the current, the voltages of the first ends of the plurality of block interconnects and the voltages of the opposed second ends of the plurality of block interconnects.

14. The method of claim 13, further comprising:
calculating an estimate of the current of the battery pack based upon the voltages of the first ends of the interconnects, the voltages of the opposed second ends of the plurality of block interconnects, and the calculated interconnect resistance of two of the plurality of block interconnects, in response to a failure of a current sensor.

15. The method of claim 13, further comprising:
maintaining operation of a first voltage measurement unit in an event of a failure of a second voltage measurement unit, wherein the first voltage measurement unit is configured to measure the voltages of the first ends of the plurality of interconnects.

16. The method of claim 13, further comprising:
maintaining operation of a second voltage measurement unit in an event of a failure of a first voltage measurement unit, wherein the second voltage measurement unit is configured to measure the voltages of the opposed second ends of the plurality of interconnects.

17. The method of claim 13, further comprising:
applying a voltage of the negative terminal as a reference voltage, wherein the voltages of the first ends of the plurality of block interconnects and the voltages of the opposed second ends of the plurality of block interconnects are measured relative to the reference voltage.

18. The method of claim 13, further comprising:
coupling a first voltage measurement unit to the negative terminal of the battery pack and to the first ends of the plurality of block interconnects, wherein the voltages of the first ends of the plurality of block interconnects are measured relative to the negative terminal of the battery pack, by the first voltage measurement unit; and coupling a second voltage measurement unit to the negative terminal of the battery pack and to the opposed second ends of the plurality of block interconnects, wherein the voltages of the opposed second ends of the plurality of block interconnects are measured relative to the negative terminal of the battery pack, by the second voltage measurement unit.

19. The method of claim 13, further comprising:
estimating resistance by application of a formula:
$R_{block\_i} + R_{interconnect\_i} = (V_i(t_1) - V_{i-1}(t_2) + V_{i-1}(t_2))/(I(t_1) - I(t_2))$,
where $R_{block\_i}$ represents the block resistance, $R_{interconnect\_i}$ represents the interconnect resistance, $V_i(t)$ represents the voltage of the $i^{th}$ block at time t, $V_{i-1}(t)$ represents the voltage of the block prior to the $i^{th}$ block at time t, and I(t) is the current at time t.

20. The method of claim 13, further comprising:
estimating current by application of a formula:
$I_{estimated} = ((V_{top\_(i+1)} - V_{top\_i}) - (V_{bottom\_(i+1)} - V_{bottom\_i}))/(R_{interconnect\_(i-1)} - R_{interconnect\_i})$,
where $I_{estimated}$ represents the estimated current, $V_{top\_i}$ represents a voltage at a top-side of an $i^{th}$ block, $V_{top\_(i+1)}$ represents a voltage at a top-side of a next consecutive block, $V_{bottom\_i}$ represents a voltage at a bottom-side of the $i^{th}$ block, $V_{bottom\_(i+1)}$ represents a voltage at a bottom-side of a next consecutive block, $R_{interconnect\_i}$ represents an interconnect resistance of the $i^{th}$ block, and $R_{interconnect\_(i-1)}$ represents the interconnect resistance of the block prior to the $i^{th}$ block.

* * * * *

UNITED STATES PATENT AND TRADEMARK OFFICE
CERTIFICATE OF CORRECTION

PATENT NO. : 10,901,019 B2
APPLICATION NO. : 13/835760
DATED : January 26, 2021
INVENTOR(S) : Biskup et al.

Page 1 of 1

It is certified that error appears in the above-identified patent and that said Letters Patent is hereby corrected as shown below:

On the Title Page

Column 2, Item (56), under "OTHER PUBLICATIONS", Line 1, delete "Mnual" and insert -- Manual --, therefor.

In the Claims

In Column 11, Claim 19, Lines 10-11, delete "$R_{block\_i}+R_{interconnect\_i}=(V_i(t_1)-V_{i-1}(t_2)+V_{i-1}(t_2))/(I(t_1)-I(t_2))$," and insert -- $R_{block\_i}+R_{interconnect\_i}=(V_i(t_1)-V_i(t_2)-V_{i-1}(t_1)+V_{i-1}(t_2))/(I(t_1)-I(t_2))$, --, therefor.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*